US009520291B2

(12) United States Patent
Tao et al.

(10) Patent No.: US 9,520,291 B2
(45) Date of Patent: Dec. 13, 2016

(54) METHOD OF PROVIDING AN IMPLANTED REGION IN A SEMICONDUCTOR STRUCTURE

(71) Applicant: IMEC VZW, Leuven (BE)

(72) Inventors: Zheng Tao, Leuven (BE); Kaidong Xu, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/757,671

(22) Filed: Dec. 23, 2015

(65) Prior Publication Data

US 2016/0196975 A1     Jul. 7, 2016

(30) Foreign Application Priority Data

Dec. 30, 2014    (EP) ..................................... 14200613
Dec. 22, 2015    (EP) ..................................... 15202051

(51) Int. Cl.
*H01L 21/306*     (2006.01)
*H01L 21/225*     (2006.01)
(Continued)

(52) U.S. Cl.
CPC ......... *H01L 21/2253* (2013.01); *H01L 21/225* (2013.01); *H01L 21/266* (2013.01);
(Continued)

(58) Field of Classification Search
CPC ............ H01L 21/31144; H01L 21/2253; H01L 21/266; H01L 21/30604; H01L 21/3085; H01L 21/845; H01L 21/823821; H01L 21/306;H01L 21/308; H01L 21/225; H01L 21/84; H01L 21/8238
See application file for complete search history.

(56) References Cited

U.S. PATENT DOCUMENTS 5,770,492 A * 6/1998 Kapoor ............ H01L 21/82389
257/E21.346
7,709,363 B2 * 5/2010 Suguro ................ H01L 21/266
257/336

(Continued)

*Primary Examiner* — Michael Trinh
(74) *Attorney, Agent, or Firm* — McDonnell Boehnen Hulbert & Berghoff LLP

(57) ABSTRACT

According to an aspect of the present inventive concept there is provided a method of providing an implanted region in a semiconductor structure including a first region and a second region, the method comprising: providing a first implantation mask covering the first region of the semiconductor structure, the first implantation mask including a first sacrificial layer, wherein the first sacrificial layer is formed as a spin-on-carbon (SOC) layer, and a second sacrificial layer, wherein the second sacrificial layer is formed as a spin-on-glass (SOG) layer; subjecting the semiconductor structure to an ion implantation process wherein an extension of the first implantation mask is such that ion implantation in the first region is counteracted and ion implantation in the second region is allowed wherein the second region is implanted; forming a third sacrificial layer covering the second region of the semiconductor structure, wherein the third sacrificial layer includes carbon; removing the second sacrificial layer at the first region by etching, wherein the third sacrificial layer protects the second region from being affected by said etching; and removing the first sacrificial layer at the first region and the third sacrificial layer at the second region by etching.

17 Claims, 10 Drawing Sheets

(51) Int. Cl.
  *H01L 21/8238* (2006.01)
  *H01L 21/311* (2006.01)
  *H01L 21/308* (2006.01)
  *H01L 21/266* (2006.01)
  *H01L 21/84* (2006.01)
(52) U.S. Cl.
  CPC .......... *H01L 21/306* (2013.01); *H01L 21/308* (2013.01); *H01L 21/3085* (2013.01); *H01L 21/30604* (2013.01); *H01L 21/31144* (2013.01); *H01L 21/8238* (2013.01); *H01L 21/823821* (2013.01); *H01L 21/845* (2013.01)

(56) References Cited

U.S. PATENT DOCUMENTS

| | | | | |
|---|---|---|---|---|
| 7,816,273 B2* | 10/2010 | Krueger | .................. | G03F 7/427 |
| | | | | 257/E21.214 |
| 9,312,127 B2* | 4/2016 | Ogihara | ............ | H01L 21/31116 |
| 2015/0064889 A1* | 3/2015 | Paraschiv | ......... | H01L 21/82343 |
| | | | | 438/514 |

* cited by examiner

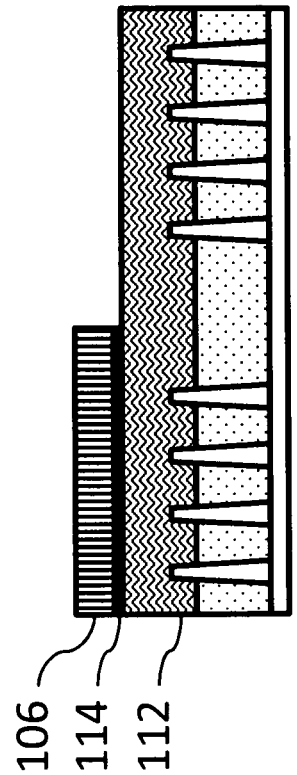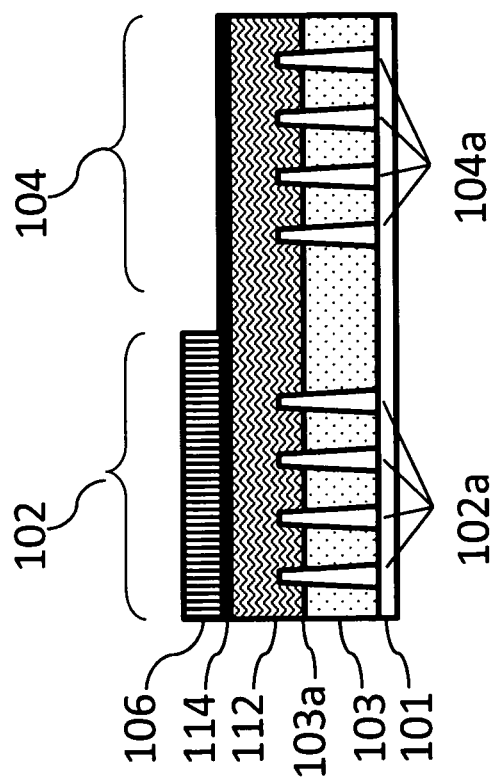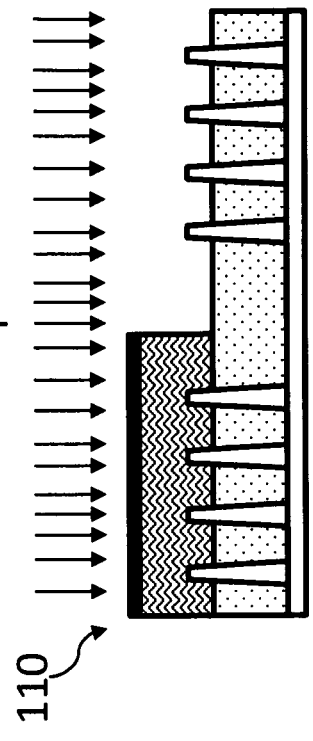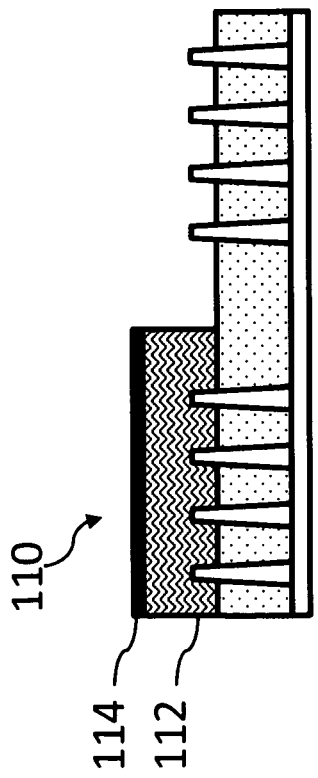
Fig. 2a
Fig. 2b
Fig. 2c
Fig. 2d

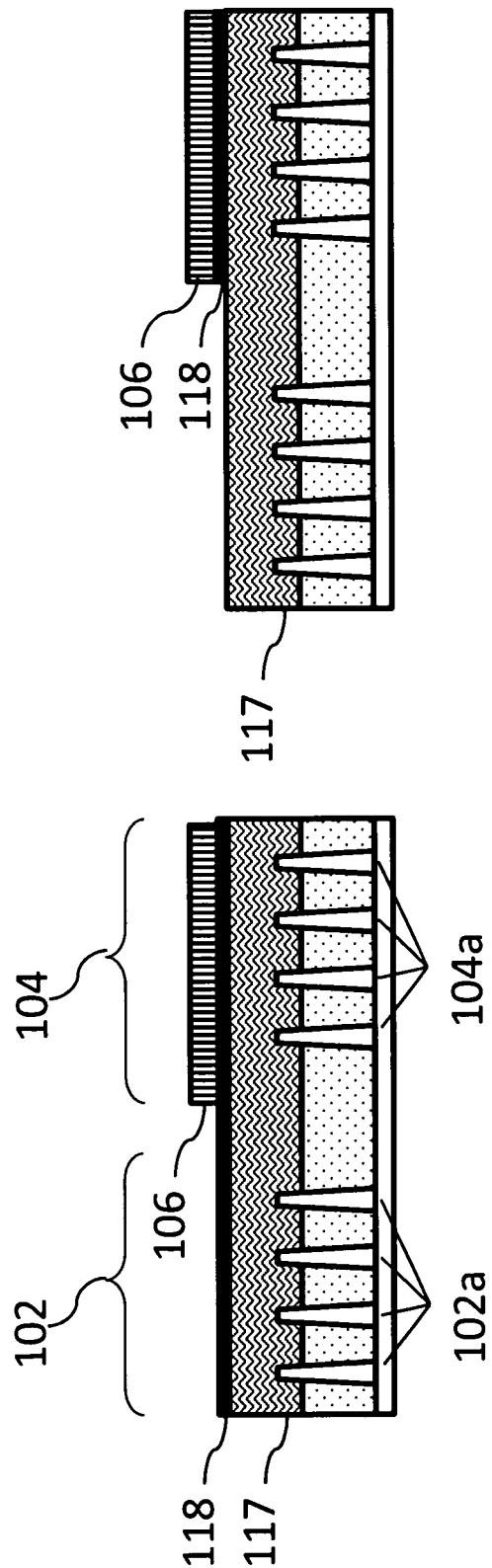
Fig. 3a
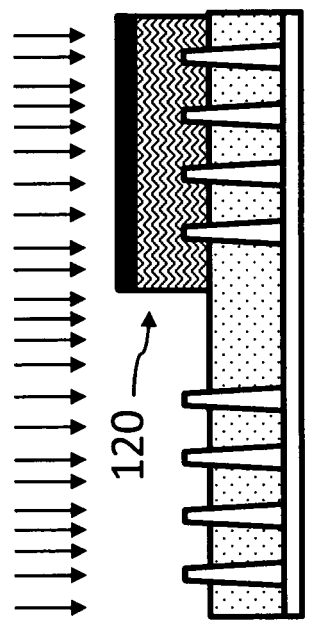
Fig. 3b
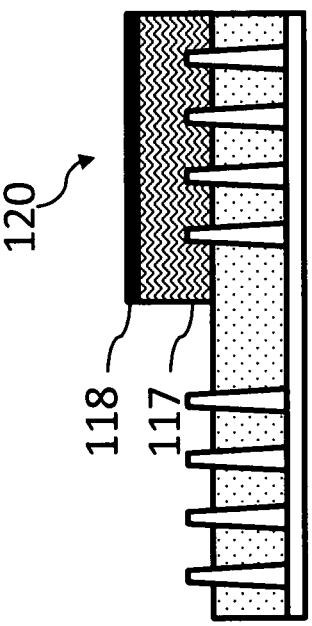
Fig. 3c
Fig. 3d

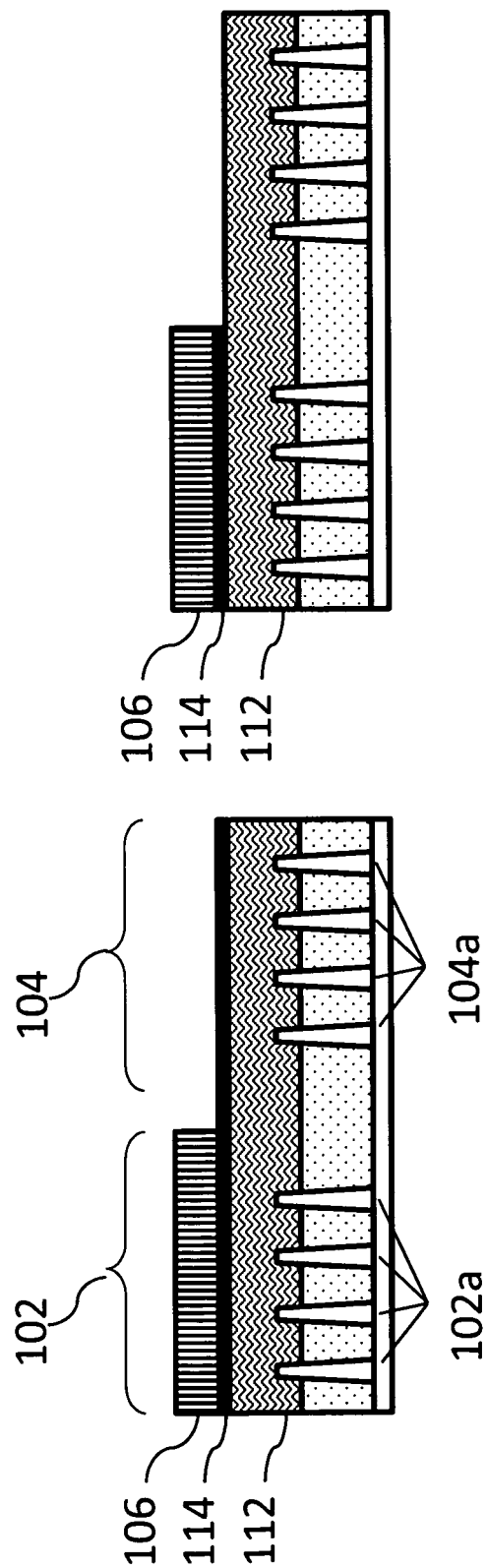
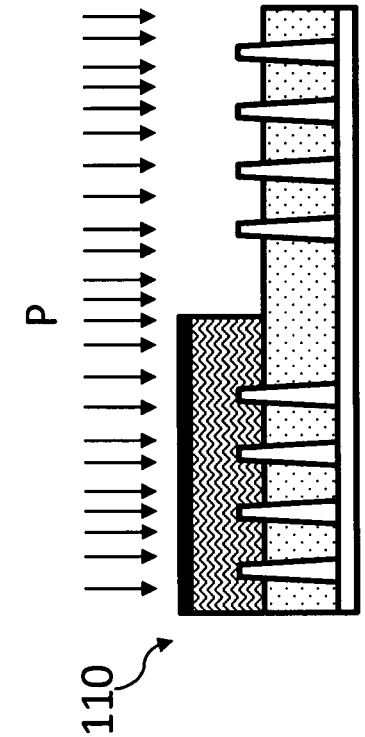
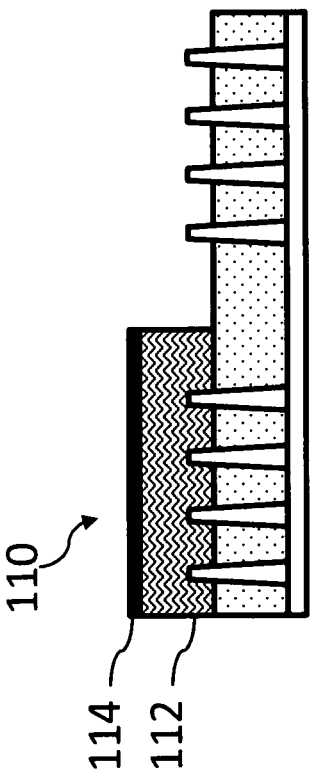
Fig. 4a
Fig. 4b
Fig. 4c
Fig. 4d

METHOD OF PROVIDING AN IMPLANTED REGION IN A SEMICONDUCTOR STRUCTURE

CROSS-REFERENCE TO RELATED APPLICATION

The present application is a non-provisional patent application claiming priority to European Patent Application No. 15202051.7 filed on Dec. 22, 2015, and European Patent Application No. 14200613.9 filed on Dec. 30, 2014, the contents of each of which are hereby incorporated by reference.

TECHNICAL FIELD

The present inventive concept relates to a method of providing an implanted region in a semiconductor structure.

BACKGROUND

In the constant strive for electronics being more power efficient, faster and having more processing power new methods for producing semiconductor devices, such as transistors, of ever decreasing dimensions are developed. This has led the semiconductor industry to develop new types of device designs such as fin-type field effect transistors, also known as FinFETs. A FinFET is a device where the conducting channel is formed by a fin-shaped structure (or shorter a "fin") that forms the body of the device and a gate stack extending across and transverse to the fin. FinFETs may also be formed as multi-channel devices with a plurality of parallel fins and one or more transversely extending gate stacks.

Traditionally during ion implantation of a FinFET, implantation masks may be used to mask portions of the semiconductor material which are not to be implanted. A good implantation stop power is desirable to limit or minimize the number of impinging ions from reaching the masked portions. However prior art processes for removing implantation masks may adversely affect the semiconductor material forming the fins. This may among others result in critical dimensions (CD) of the semiconductor device being lost. As device dimensions are reduced, CD loss becomes even less acceptable.

SUMMARY

An objective of the present inventive concept is therefore to provide a method which allows a region of a semiconductor structure to be selectively implanted. Additionally, the method should result in minimal, or at least reduced adverse effects on the semiconductor structure, compared to prior art processes.

According to a first aspect of the present inventive concept there is provided a method of providing an implanted region in a semiconductor structure including a first region and a second region, the method comprising:

providing a first implantation mask covering the first region of the semiconductor structure, the first implantation mask including a first sacrificial layer, wherein the first sacrificial layer is formed as a spin-on-carbon (SOC) layer, and a second sacrificial layer, wherein the second sacrificial layer is formed as a spin-on-glass (SOG) layer, subjecting the semiconductor structure to an ion implantation process wherein an extension of the first implantation mask is such that ion implantation in the first region is counteracted and ion implantation in the second region is allowed wherein the second region is implanted, forming a third sacrificial layer covering the second region of the semiconductor structure, wherein the third sacrificial layer includes carbon, removing the second sacrificial layer at the first region by etching, wherein the third sacrificial layer protects the second region from being affected by said etching, and removing the first sacrificial layer at the first region and the third sacrificial layer at the second region by etching.

The inventors have realized that an implantation mask including a SOG-layer and a SOC-layer (i.e. a "SOG/SOC stack") provides good implantation stop power. Using a SOG/SOC stack, shadowing effects during the ion implantation process may be minimized or at least reduced compared to prior art processes using other layer combinations for the implantation mask and hence typically requiring a thicker mask.

However, state of the art etching processes which may be used to efficiently remove the SOG-layer, i.e. the second sacrificial layer, may adversely affect the semiconductor conductor material as well as (if any) sensitive materials and structures provided at the semiconductor structure, such as a field oxide layer, other insulating layers, gate stacks etc. Adverse effects may include topography changes, CD loss, altered doping concentrations in the semiconductor structure (e.g. in the second region) etc. However, the third sacrificial layer is arranged to protect the second region from being affected by the etching of the second sacrificial layer. By forming the third sacrificial layer prior to removing the SOG-layer (i.e. the second sacrificial layer) in accordance with the inventive method, the second sacrificial layer may thus be efficiently and safely removed without affecting the second region of the semiconductor structure. Critical dimensions of the semiconductor structure may thereby be maintained during the removal of the second sacrificial layer. Other materials and structures provided at the semiconductor structure and covered by the third sacrificial layer may also be protected during the removal of the second sacrificial layer.

The third sacrificial layer may protect the second region from being affected by said etching by preventing or at least shielding the second region of the semiconductor structure from the etchant(s) used for removing the second sacrificial layer.

Available etching processes which may be used to efficiently remove the first and the third sacrificial layer (which both include carbon) are relatively harmless to the semiconductor structure and to the field oxide layer, other insulating layers or gate stacks which may be provided at the semiconductor structure. Following removal of the second sacrificial layer, the first and the third sacrificial layer may thus be efficiently and safely removed from the first region and the second region of the semiconductor structure. Thereby, the first and the second region of the semiconductor structure may be exposed.

An implantation mask "covering" a region (e.g. "the first implantation mask covering the first region") should in this context be understood as the implantation mask covering the region of the semiconductor structure as viewed along the direction of incidence of the ions accelerated towards the semiconductor structure during the ion implantation process. The mask may thus "cover" a region with zero or more intermediate layers or intermediate structures being present between the mask and the region of the semiconductor structure.

In this context an "ion implantation process" may be any process wherein ions are accelerated (e.g. using an electrical field) towards and impacted into the semiconductor structure.

The first region may generally refer to a region of the semiconductor structure which during a first ion implantation process is not intended to be implanted. The second region may generally refer to a region of the semiconductor structure which during a first ion implantation process is desired to be implanted.

The semiconductor structure may be provided on a substrate wherein the first and the second regions may be provided at a same side or face of the substrate. The first and the second region may be provided adjacent or side-by-side in relation to each other, or spaced apart.

A spin-on-carbon (SOC) layer (e.g. the first sacrificial layer) is a layer formed by a SOC material. The SOC material forming the layer may include a carbon compound, a polymer, polymers or a combination thereof. The SOC layer may be formed by depositing the SOC material using a spin deposition process.

A spin-on-glass (SOG) layer (e.g. the second sacrificial layer) is a layer formed by SOG material. The SOG material forming the layer may include silicate-SOG (i.e. an SOG formed from one or more silicate based compounds), organosilicon-SOG (i.e. an SOG formed from one or more organosilicon compounds). The SOG layer may be formed by depositing the SOG material using a spin deposition process.

A SOG layer (e.g. the second sacrificial layer) may be removed using a first etching process and a layer including carbon (e.g. the first sacrificial layer and the third sacrificial layer) may be removed using a second etching process which is different from the first etching process. More specifically, the first etching process may be arranged to etch the second sacrificial layer at a higher rate than the first sacrificial layer and the third sacrificial layer. Conversely, the second etching process may be arranged to etch the first sacrificial layer and/or the third sacrificial layer at a higher rate than the second sacrificial layer. Thus, the first etching process may be used to selectively etch the second sacrificial layer off from the first sacrificial layer. The second etching process may be used to selectively etch the first sacrificial layer and the third sacrificial layer off from the semiconductor structure (i.e. without affecting the semiconductor structure). Advantageously, a layer including carbon may be removed by etching using an $O_2$-based dry etch. A SOG layer may be removed by etching using a fluorine-based dry etch or wet etch (including e.g. $CF_4$).

Owing to the nature of spin deposition the first sacrificial layer and the second sacrificial layer may be formed to be "self-planarizing". In other words, the first sacrificial layer and the second sacrificial layer may form a respective planarized surface without requiring any separate planarization step to planarize (i.e. flatten or smoothen) the surface, subsequent to deposition.

The first sacrificial layer and the third sacrificial layer may be arranged to be etched by a same etchant. Thereby the first and the third sacrificial layer may be efficiently removed during a same etching process. In other words, the first and the third sacrificial layer may be removed simultaneously by the same etching process. However, as will be understood from the following the first and third sacrificial layer may also be removed using different etching processes, at different stages of the method.

The third sacrificial layer may include a carbon compound such as a polymer or a combination of different types of polymers.

The third sacrificial layer may be formed as a spin-on-carbon layer. The details and advantages discussed above concerning SOC layers, such as the first sacrificial layer, apply correspondingly to the third sacrificial layer.

The third sacrificial layer may be formed as a bottom anti-reflective coating, BARC. The BARC (or synonymously BARC-layer) may be formed by using a spin deposition process or some other state of the art deposition process suitable for this purpose.

The third sacrificial layer may be formed to cover the second region and the second sacrificial layer at the first region, and wherein the method may further comprise: etching an exposed surface of the third sacrificial layer until the second sacrificial layer at the first region is exposed and, thereafter removing the second sacrificial layer at the first region by etching. Good coverage by the third sacrificial layer may thus be achieved and, subsequently, access to the second sacrificial layer may be obtained, which thereafter may be removed.

According to one embodiment the method further comprises, subsequent to removing the first sacrificial layer at the first region and the third sacrificial layer at the second region:

providing a second implantation mask covering the second region of the semiconductor structure, the second implantation mask including a first sacrificial layer, wherein the first sacrificial layer of the second implantation mask is formed as a SOC-layer, and a second sacrificial layer, wherein the second sacrificial layer of the second implantation mask is formed as a SOG-layer, subjecting the semiconductor structure to an ion implantation process wherein an extension of the second implantation mask is such that ion implantation in the second region is counteracted and ion implantation in the first region is allowed wherein the first region is implanted, forming a fourth sacrificial layer covering the first region of the semiconductor structure, wherein the fourth sacrificial layer includes carbon, removing the second sacrificial layer of the second implantation mask at the second region by etching, wherein the fourth sacrificial layer protects the first region from being affected by said etching, and removing the first sacrificial layer of the second implantation mask at the second region and the fourth sacrificial layer at the first region by etching.

According to this embodiment, both the first region and the second region may be separately and selectively implanted. The details and advantages discussed in connection with the above-described first aspect of the inventive concept apply correspondingly to this embodiment. In particular, the discussion concerning the first and the second sacrificial layer of the first implantation mask and third sacrificial layer apply correspondingly to the first and the second sacrificial layer of the second implantation and mask and the fourth sacrificial layer, respectively.

The first sacrificial layer of the second implantation mask and the fourth sacrificial layer may be arranged to be etched by a same etchant. Thereby the first and the fourth sacrificial layer may be efficiently removed during a same etching process.

The fourth sacrificial layer may be formed to cover the first region and the second sacrificial layer of the second implantation mask at the second region, and wherein the method may further comprises: etching an exposed surface of the fourth sacrificial layer until the second sacrificial layer of the second implantation mask at the second region is exposed and, thereafter removing the second sacrificial layer of the second implantation mask at the second region by etching. Good coverage by the fourth sacrificial layer may thus be achieved and, subsequently, access to the second sacrificial layer may be obtained, which thereafter may be removed.

According to one embodiment the method further comprises, subsequent to forming the third sacrificial layer at the second region of the semiconductor structure and prior to removing the first sacrificial layer at the first region and the third sacrificial layer at the second region by etching:

forming a fourth sacrificial layer at the first and the second region, wherein the fourth sacrificial layer is formed as a spin-on-glass layer, removing the fourth sacrificial layer at the first region by etching wherein the first sacrificial layer protects the first region from being affected by said etching, removing the first sacrificial layer at the first region, wherein the third sacrificial layer at the second region and the fourth sacrificial layer at the second region forms a second implantation mask covering the second region of the semiconductor structure, and subjecting the semiconductor structure to an ion implantation process wherein an extension of the second implantation mask is such that ion implantation in the second region is counteracted and ion implantation in the first region is allowed wherein the first region is implanted.

Thereby both the first region and the second region may be implanted to obtain the desired respective properties wherein the third sacrificial layer provides the double function of protecting the second region during the removal of the second and fourth sacrificial layer and also (by forming part of the second implantation mask) protecting the second region during the ion implantation of the first region. Resource utilization may hence be improved.

More specifically, it is thus provided a method of providing an implanted region in the semiconductor structure including the first region and the second region, the method comprising:

providing a first implantation mask covering the first region of the semiconductor structure, the first implantation mask including a first sacrificial layer formed as a spin-on-carbon (SOC) layer and a second sacrificial layer formed as a spin-on-glass (SOG) layer, subjecting the semiconductor structure to a first ion implantation process wherein an extension of the first implantation mask is such that ion implantation in the first region is counteracted and ion implantation in the second region is allowed wherein the second region is implanted, forming a third sacrificial layer covering the second region of the semiconductor structure, wherein the third sacrificial layer includes carbon, forming a fourth sacrificial layer at the first and the second region, wherein the fourth sacrificial layer is formed as a spin-on-glass layer, removing the second sacrificial layer and the fourth sacrificial layer at the first region by etching wherein the first sacrificial layer protects the first region from being affected by said etching and the third sacrificial layer protects the second region from being affected by said etching, removing the first sacrificial layer at the first region, wherein the third sacrificial layer at the second region and the fourth sacrificial layer at the second region forms a second implantation mask covering the second region of the semiconductor structure, and subjecting the semiconductor structure to a second ion implantation process wherein an extension of the second implantation mask is such that ion implantation in the second region is counteracted and ion implantation in the first region is allowed wherein the first region is implanted.

The fourth sacrificial layer may be formed prior to or subsequent to removing the second sacrificial layer at the first region by etching.

The method may further comprise, subsequent to implanting the first region by the second ion implantation process:

forming a fifth sacrificial layer at the first region of the semiconductor structure, wherein the fifth sacrificial layer includes carbon, removing the fourth sacrificial layer of the second implantation mask at the second region by etching wherein the fifth sacrificial layer protects the first region from being affected by said etching, and removing the third sacrificial layer of the second implantation mask at the second region and the fifth sacrificial layer at the first region by etching.

The fifth sacrificial layer enables the fourth sacrificial layer to be efficiently and safely removed without affecting the first region of the semiconductor structure. Critical dimensions of the semiconductor structure may thereby be maintained during the removal of the fourth sacrificial layer.

Following removal of the fourth sacrificial layer, the third sacrificial layer and the fifth sacrificial layer may be removed from the semiconductor structure by etching. Thereby, the first and the second region of the semiconductor structure (which now both have been implanted) may be exposed. As discussed above, available etching processes which may be used to efficiently remove carbon-including-layers (e.g. the third and the fifth sacrificial layers) are relatively harmless to the semiconductor structure. The third and the fifth sacrificial layers may thus be efficiently and safely removed from the first region and the second region of the semiconductor structure. Thereby, the first and the second region of the semiconductor structure may be exposed. The further details and advantages discussed in connection with the above-described first aspect of the inventive concept may apply correspondingly to this embodiment. In particular, the discussion concerning the second sacrificial layer may apply correspondingly to the fourth sacrificial layer. For instance, the fourth sacrificial layer may be formed as a BARC. Likewise, the discussion concerning the third sacrificial layer may apply correspondingly to the fifth sacrificial layer. Accordingly, the third sacrificial layer may be formed as a spin-on-carbon layer or BARC layer. Also the fifth sacrificial layer may be formed as a spin-on-carbon layer or a BARC layer.

The third sacrificial layer of the second implantation mask and the fifth sacrificial layer may be arranged to be etched by a same etchant. Thereby the third and the fifth sacrificial layer may be efficiently removed during a same etching process. In other words, the first and the third sacrificial layer may be removed simultaneously by the same etching process. Additionally, the first sacrificial layer of the first implantation mask, the third sacrificial layer and the fifth sacrificial layer may be arranged to be etched by a same etchant.

The fifth sacrificial layer may be formed to cover the first region and the fourth sacrificial layer at the second region, and wherein the method may further comprise etching an exposed surface of the fifth sacrificial layer until the fourth sacrificial layer at the second region is exposed and, thereafter removing the fourth sacrificial layer of the second implantation mask at the second region by etching. Good coverage by the fifth sacrificial layer may thus be achieved and, subsequently, access to the fourth sacrificial layer may be obtained, which thereafter may be removed.

The above disclosed methods including implantation of the second region may be applied for implanting the second region to form an n-well region or a p-well region, or an n-MOS region or a p-MOS region. Correspondingly, the above disclosed methods including implantation of the first region may be used for implanting the first region to form a p-well region or an n-well region, or a p-MOS region or an n-MOS region.

According to one embodiment the first region of the semiconductor structure includes at least one fin-shaped feature and the second region of the semiconductor structure includes at least one fin-shaped feature. Thereby, the methods of above may be applied for implanting semiconductor fins. The methods of above may hence be used in connection with FinFETs. Due to the features (i.e. the "fins") being protruded and their comparably small transverse width dimensions, the above disclosed methods may be particularly advantageous to preserve the transverse critical dimension. It should however be noted that the methods of above also may be used in connection with other semiconductor structures, e.g. in connection with planar devices.

According to one embodiment a gate structure is arranged at the semiconductor structure. A gate structure (e.g. including a set of gate stacks) may be provided at each one of the first region and the second region. A gate structure may be provided at the semiconductor structure prior to providing the first and the second implantation masks wherein the gate structure may be present at the first and/or the second region during the above described method stages. A gate structure may also be provided at the semiconductor after the above described methods have been applied for implanting the second region (and if applicable the first region). Similar methods may thereafter be applied for implanting the second region (and if applicable the first region) again using a third (and a fourth) ion implantation process, respectively. In that case, the first, the third and the fifth sacrificial layers as defined above should be formed to cover also the gate structure at the first or the second region as the case may be.

The gate structure may be provided at the second region, wherein the second region may be implanted to form a source and a drain region. The source region and the drain region may be formed at opposite sides of the gate structure. A gate structure may also be provided at the first region, wherein the first region may be implanted to form a source and a drain region. The source region and the drain region may be formed at opposite sides of the gate structure.

According to an alternative second aspect there is provided a method of providing an implanted region in a semiconductor structure including a first region and a second region, the method comprising:

providing a first implantation mask covering the first region of the semiconductor structure, the first implantation mask including a first sacrificial layer, wherein the first sacrificial layer is formed as a spin-on-carbon layer, and a second sacrificial layer, wherein the second sacrificial layer is formed as a spin-on-glass layer, subjecting the semiconductor structure to an ion implantation process wherein an extension of the first implantation mask is such that ion implantation in the first region is counteracted and ion implantation in the second region is allowed wherein the second region is implanted, forming a third sacrificial layer covering the second region of the semiconductor structure, wherein the third sacrificial layer includes carbon, and removing the first sacrificial layer of the first implantation mask, the second sacrificial layer of the first implantation mask and the third sacrificial layer by a same etching process including an etchant comprising fluoride.

"A same etching process" should in this context be understood as an etching process including an etchant which is adapted to etch all of said layers until they are removed from the semiconductor structure. The etchant may comprise may include $CF_4$, $SF_6$ or another fluoride-based etchant.

A fluoride-containing etchant allows the "SOG/SOC stack" forming the first implantation mask and the carbon-containing third sacrificial layer (which also may be a SOC material) to be efficiently removed.

According to this aspect the second sacrificial layer is not removed in a separate etching process (while the third sacrificial layer protects the second region). In contrast, the objective allowing the first region to be selectively implanted while avoiding adverse effects on the underlying semiconductor structure (which for instance may include fins) is addressed by providing the third sacrificial layer to cover the second region and simultaneously removing the first sacrificial layer of the first implantation mask, the second sacrificial layer of the first implantation mask and the third sacrificial layer by a same etching process. The presence of the third sacrificial layer, and the removal thereof simultaneous to the first implantation mask, enables an issue of micro-loading of the second region of the semiconductor structure, which otherwise may occur during removal of the first implantation mask, to be avoided or at least reduced.

According to one embodiment the third sacrificial layer is formed to cover the second region and the second sacrificial layer at the first region, the method further comprising:

reducing a thickness of the third sacrificial layer at the first region and at the second region by etching an exposed surface of the third sacrificial layer until a residual portion of the third sacrificial layer remains on the second sacrificial layer, or until the second sacrificial layer at the first region is exposed, and thereafter removing the first sacrificial layer, the second sacrificial layer and the third sacrificial layer, and said residual portion if present on the second sacrificial layer, by said same etching process.

The third sacrificial layer may thus be formed with a thickness which at least meets, and optionally exceeds, a thickness of the first implantation mask. The more similar the thickness (i.e. the less the thickness of the residual layer) the less micro-loading of the second region may occur. This may be understood from considering that etching a structure of a non-uniform thickness will result in different portions of the underlying structure being exposed at different stages during the etching process. Consequently, portions of the underlying structure may be exposed to the etchant for a longer time, which portions thereby may react with the etchant during a substantial time and therefore be adversely affected. Such portions may hence suffer from micro-loading (including for instance topography changes or CD loss).

Etching the third sacrificial layer until the second sacrificial layer at the first region is exposed enables the third sacrificial layer to become flush with the exposed surface of the second sacrificial layer. The micro-loading issue may thus be advantageously reduced.

The discussion above regarding particular materials of the sacrificial layers and process aspects may apply correspondingly to the second aspect wherefore reference is made to the above.

Furthermore, an analogous approach may be applied in connection with a second implantation mask. Hence, according to one embodiment, the method further comprises, subsequent to removing the first sacrificial layer, the second sacrificial layer and the third sacrificial layer:

providing a second implantation mask covering the second region of the semiconductor structure, the second implantation mask including a first sacrificial layer, wherein the first sacrificial layer of the second implantation mask is formed as a spin-on-carbon layer, and a second sacrificial layer, wherein the second sacrificial layer of the second implantation mask is formed as a spin-on-glass layer, subjecting the semiconductor structure to an ion implantation process wherein an extension of the second implantation mask is such that ion implantation in the second region is counteracted and ion implantation in the first region is allowed wherein the first region is implanted, forming a fourth sacrificial layer covering the first region of the semiconductor structure, wherein the fourth sacrificial layer includes carbon, and removing the first sacrificial layer of the second implantation mask, the second sacrificial layer of the second implantation mask and the fourth sacrificial layer by a same etching process including an etchant comprising fluoride.

According to one embodiment, the fourth sacrificial layer is formed to cover the first region and the second sacrificial layer at the second region, the method further comprising:

reducing a thickness of the fourth sacrificial layer at the first region and at the second region by etching an exposed surface of the fourth sacrificial layer until a residual portion of the fourth sacrificial layer remains on the second sacrificial layer at the second region, or until the second sacrificial layer at the second region is exposed, and thereafter removing the first sacrificial layer of the second implantation mask, the second sacrificial layer of the second implantation mask, the fourth sacrificial layer, and said residual portion if present on the second sacrificial layer of the second implantation mask, by said same etching process.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings. In the drawings like reference numerals will be used for like elements unless stated otherwise.

FIGS. 2a-h schematically illustrates a method of implanting a second region of the semiconductor structure.

FIGS. 3a-h schematically illustrates a method of implanting a first region of the semiconductor structure.

DETAILED DESCRIPTION OF PREFERRED EMBODIMENTS

Detailed embodiments of the present inventive concept will now be described with reference to the drawings.

Figure 1:
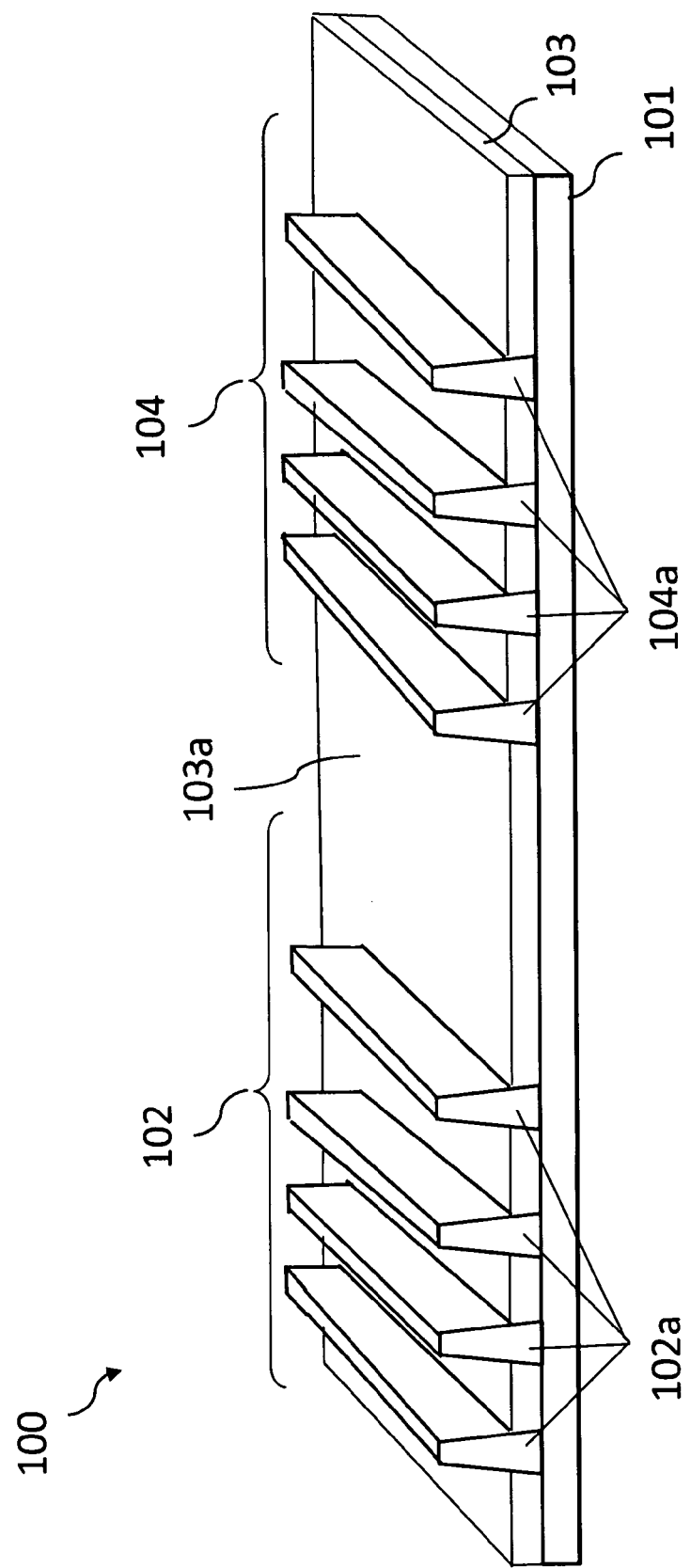
FIG. 1 schematically illustrates a semiconductor structure.

FIG. 1 is a schematic perspective view of a semiconductor structure 100. The semiconductor structure 100 includes a first region 102 and a second region 104. The first region 102 and the second region 104 are provided on a same face of a substrate 101. The substrate may for example be a silicon (SI) substrate, a silicon on insulator (SOI) substrate, a germanium substrate, a gallium arsenide substrate, a gallium arsenide phosphide substrate, an indium gallium arsenide substrate, a silicon germanium substrate, a silicon on glass substrate, a silicon on sapphire substrate or a germanium on insulator substrate. In FIG. 1, the first region 102 and the second region 104 are provided slightly spaced apart along the face of the substrate 101. However, the methods that are to be described in the following are applicable also to a semiconductor structure having a first region and a second region which are directly adjacent to each other. As is understood by the skilled person the structure shown in FIG. 1 may represent a portion of a much larger wafer including a plurality of first and second regions.

Each one of the first region 102 and the second region 104 includes a number of fin-shaped features or "fins" 102a and 104a, respectively. The fins 102a and 104a protrude from the surface of the substrate 101. Although the first region 102 and the second region 104 are shown to include four fins 102a, 104a, this is merely one example and the first and the second regions 102, 104 may each include one, two, three or even more than four fins, depending on the application in which the semiconductor structure 100 is to be used. The number of fins 102a in the first region 102 need also not be equal to the number of fins 104a in the second region 104.

The fins 102a, 104a of the first region 102 and the second region 104 may be formed by epitaxially growing the fins on the substrate 101, for example using chemical vapor deposition (CVD). However any other technique which is known in the art and which is suitable for forming such a structure may also be used. Purely by way of example, using state of the art techniques the fins 102a, 104a may be formed with a height above the surface of the substrate 101 in the order of 10-50 nm and a transverse dimension (i.e. width) in the order of 14 nm, 10 nm or 7 nm. The materials used for forming the semiconductor structure 100 may be selected depending on the application for the semiconductor structure 100 and the type of substrate 101. As a non-limiting example, in case of a SI- or SOI-substrate 101 the semiconductor structure 100 may be formed from SI, Ge or from III-V materials. The fins 102a, 104a of the semiconductor structure 100 may also be formed from a bulk semiconductor wafer.

As illustrated in FIG. 1, an insulating layer 103 may also be provided on the substrate 101. The insulating layer 103 may be present between the first region 102 and the second region 104 and also in the trenches formed between the fins 102a of the first region 102 and the fins 104a of the second region 104. To improve the insulating properties the insulating layer 103 may be formed using a shallow trench isolation process (STI process) as is commonly known in the art. Moreover, a field oxide layer 103a may be provided on the insulating layer 103.

As may be understood by a person skilled in the art the structure illustrated in FIG. 1 may form the basis for forming a FinFET device, e.g. by providing one or more a gate stacks in the first region 102 and the second region 104a. Accordingly in the below, methods for selectively implanting the first region 102 and the second region 104 of the semiconductor structure 100 will be described. The first region 102 may for example be implanted to form an n-MOS region and the second region 104 may be implanted to form an p-MOS region, or vice versa. In the following methods of implanting the first region 102 and/or the second region 104 will be described in connection with the semiconductor structure 100 including fins 102a, 104a. The methods have a more general applicability and may thus also be used for implanting corresponding first and/or second regions for a planar device. It would also be possible to use the methods for implanting corresponding first and/or second regions as a p-well and an n-well region, respectively, or vice versa.

FIGS. 2a-h schematically illustrate steps of a method of implanting the second region 104 of the semiconductor structure 100. The figures show corresponding cross-sections of the semiconductor structure 100 at different stages of the method. Purely to facilitate understanding, different layers are shown with different filling patterns. This should not be construed in any limiting sense. The method comprises providing an implantation mask 110. The implantation mask 110 will in the following be referred to as the first implantation mask 110. The first implantation mask 110 covers the first region 102 of the semiconductor structure 100. The first implantation mask 110 includes a first sacrificial layer 112 and a second sacrificial layer 114.

FIGS. 2a-c illustrates one possible manner of providing the first implantation mask 110. A first sacrificial layer 112 is formed on the substrate 101 to cover the first and the second regions 102, 104 of the semiconductor structure 100. In this context, providing/forming/depositing a mask/layer "on" a substrate/layer should be understood as providing/forming/depositing said mask/layer on said substrate/layer with zero, one or more intermediate layers between said mask/layer and said substrate/layer. Accordingly, with respect to the first sacrificial layer 112 being formed on the substrate 101, the insulating layer 103 and the field oxide 103a may form such intermediate layers however even further layers (e.g. a stack of different oxide layers) may be present.

The first sacrificial layer 112 may be in direct contact with the first region 102 and the second region 104 of the semiconductor structure 100. Alternatively the first sacrificial layer 112 may be in contact with the first region 102 via one or more intermediate layers (for example one or more oxide layers), in case such intermediate layer are present on the semiconductor structure 100.

The first sacrificial layer 112 is formed as a spin-on-carbon (SOC) layer. A carbon- or polymer-based SOC material may be deposited to cover the first region 102 and the second region 104 of the semiconductor structure 100 in a spin deposition process. For curing the SOC layer a baking step may be applied as is well-known in the art. The second sacrificial layer 114 is formed as a spin-on-glass (SOG) layer. A silicate- or organosilicon-based material may be deposited to cover the first sacrificial layer 112 in a spin deposition process. For curing the SOG layer a baking step may be applied as is well-known in the art. The second sacrificial layer 114 may form a dielectric antireflective coating (DARC) of the first implantation mask 110. Spin deposition processes in general, in particular for forming SOC- and SOG-layers are, as such, well-known in the art and will therefore not be described further herein. The first sacrificial layer 112 and the second sacrificial layer 114 may each be separately deposited to form self-planarizing layers.

The thickness of the first sacrificial layer 112 should be at least such that ion implantation may be prevented in the first region 102 during a subsequent ion implantation process (see below). Thereby, the SOG/SOC stack of the first implantation mask 110 may provide a desired implantation stop power or masking/shielding efficiency against impinging ions during the subsequent ion implantation process. Furthermore, the thickness of the first sacrificial layer 112 should be at least such that the fins 102a and 104a are covered by the first sacrificial layer 112.

The lateral extensions of the first implantation mask 110 may be defined in a lithography process. A patterned photo resist 106 having a lateral extension corresponding to the desired lateral extension of the first implantation mask 110 may as illustrated in FIG. 2a be provided at the first region 102. The photo resist 106 may for example be provided on the second sacrificial layer 114 by spin coating. The photo resist 106 may be any type of which is capable of protecting portions of the second sacrificial layer 114 covered by the patterned photo resist 106 from being affected during etching of the second sacrificial layer 114.

Following an exposure and develop process, portions of the second sacrificial layer 114 which are not covered by the patterned photo resist 106 may be selectively removed by etching (FIG. 2b). The second sacrificial layer 114 may be removed using a dry-etch process. The etchant(s) used for removing the second sacrificial layer 114 may generally be of any type which is able to efficiently etch the second sacrificial layer 114. More specifically, the etching process should be selective for the second sacrificial layer 114. In other words the etching process should be arranged to etch the second sacrificial layer 114 at a greater rate than the first sacrificial layer 112 and the patterned photo resist 106, such that the second sacrificial layer 114 may be removed substantially without affecting the underlying first sacrificial layer 112. As one example, a fluorine-based plasma (such as $CF_4$) may be used for efficiently etching the DARC/SOG layer formed by the second sacrificial layer 114.

Following the removal of the second sacrificial layer 114, portions of the first sacrificial layer 112 which not are covered by the second sacrificial layer 114 may be removed by etching, wherein the first implantation mask 110 is defined (FIG. 2c). The first sacrificial layer 112 may be removed using a dry-etch process. As one example, an $O_2$-based plasma or an $N_2/H_2$-based plasma may be used. To improve profile control during the etching the plasma may include a polymer such as $CH_4$, $CO_2$, $CO$, $COS$ or $SO_2$. Control of the critical lateral dimensions of the first implantation mask 110 may hence be improved. The photo resist 106 may also be removed during the etching process however a separate step of removing the photo resist 106 may also be used.

Subsequent to providing the first implantation mask 110 at the first region 102, the semiconductor structure 100 is subjected to an ion implantation process, schematically indicated by P in FIG. 2d. The extension of the first implantation mask 110 is such that ion implantation in the first region 102 (which is covered by the first implantation mask 110) is counteracted and ion implantation in the second region 104 (which is left exposed by the first implantation mask 110) is allowed wherein the second region 104 may be selectively implanted. The implantation ions may be of a type which is suitable for providing the second region 104 with the desired electrical properties. In case the second region 104 is to form an n-MOS region or a p-MOS region the ions may include an n-type dopant or a p-type dopant, respectively.

It should be noted that although the first implantation mask 110 preferably should provide complete prevention of ion implantation in the first region 102 some degree of implantation in the first region 102 may be tolerable in practical circumstances. For example, depending on the angle and any divergence of the ion beam during the ion implantation process, some ion implantation may occur in portion of the first region 102 underlying the edges of the first implantation mask 110. However even in such a case the first implantation mask 110 will, during the ion implantation process, at least reduce or limit the number of implanted ions in the first region 102 to a fraction of the number of implanted ions in the second region 104.

In addition to shielding the semiconductor structure 100 in the first region 102, the first implantation mask 110 may shield any further layers covered by the first implantation mask 110, such as the insulation layer 103 and the field oxide 103a. Undesired changes in topography or electrical properties of such layers may thus be counteracted.

Figure 2E:
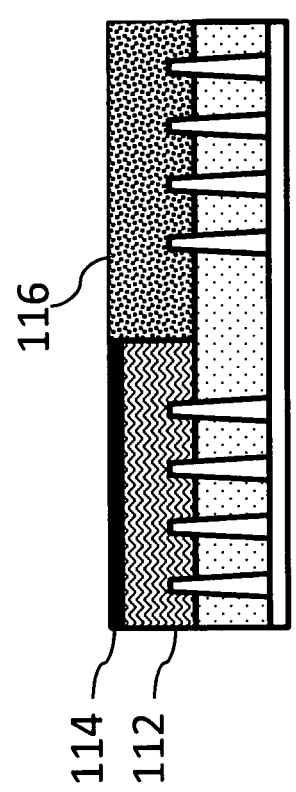

Following the ion implantation process, a third sacrificial layer 116 covering the second region 104 of the semiconductor structure 100 is formed (FIG. 2e). The third sacrificial layer 116 is formed on the substrate 101. The third sacrificial layer 116 is formed as a SOC layer. The material may be of a same type as that used for forming the first sacrificial layer 112. However, whereas the material forming the first sacrificial layer 112 preferably should be suitable to (in combination with the second sacrificial layer 114) withstand the implantation process P, the third sacrificial layer 116 may be selected without consideration of implantation stop power. In fact, the third sacrificial layer 116 may be any type of SOC layer that during deposition provides adequate coverage of the second region 104 and optionally also is self-planarizing such that a further planarization step is not necessary. According to yet another example the third sacrificial layer 116 may be formed as an organic bottom anti-reflective coating (BARC). The BARC (i.e. "BARC layer 116") may be formed by deposition of a material including a carbon compound. The BARC layer 116 may be formed using a spin deposition process however other state of the art deposition process suitable for this purpose may be also be used.

Figure 2F:
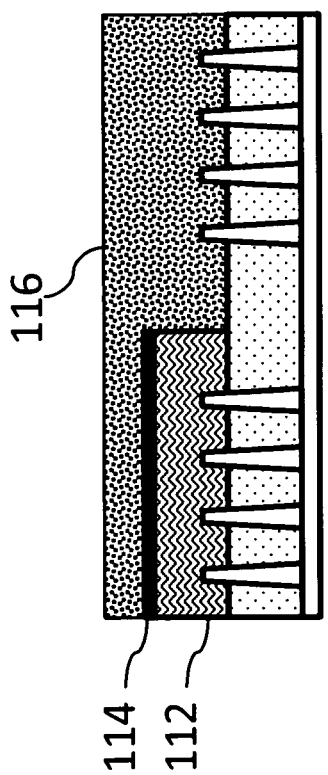

As illustrated in FIG. 2e, the third sacrificial layer 116 may be formed to cover also the second sacrificial layer 114 at the first region 102. In that case an exposed surface of the third sacrificial layer 116 may be etched until the second sacrificial layer 114 of the first implantation mask 110 is exposed (FIG. 2f). In FIG. 2f, the third sacrificial layer 116 is illustrated as being substantially flush with the exposed surface of the second sacrificial layer 114. However, in practice the final thickness of the third sacrificial layer 116 following the etching process may be less than the thickness of the first implantation mask 110. Alternatively, if the third sacrificial layer 116 is formed to cover also the second sacrificial layer 114 at the first region 102, the etching of the third sacrificial layer 116 may be stopped before the second sacrificial layer 114 is exposed. The remaining layer portion of the second sacrificial layer 114 on the second sacrificial layer 114 may be referred to as a residual portion of the third sacrificial layer 114. In any case, the final thickness of the third sacrificial layer 116 should be at least such that the fins 104a are covered by the third sacrificial layer 116. Instead of overgrowing and subsequently etching back the third sacrificial layer 116 to expose the second sacrificial layer 114, the third sacrificial layer 116 may be deposited with a thickness such that the second sacrificial layer 114 is not covered by the third sacrificial layer 116, wherein the etch back process occurring between FIG. 2e and FIG. 2f may be omitted.

Figure 2G:
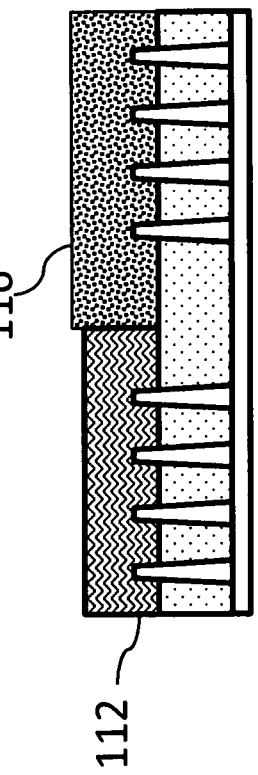
Figure 2H:
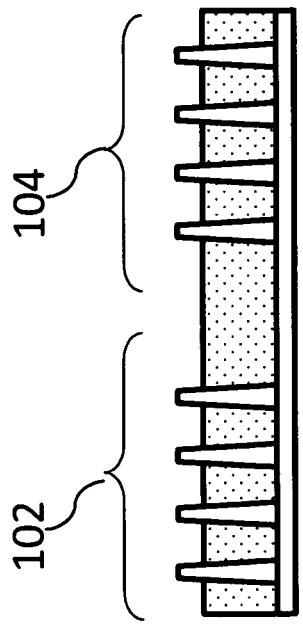

After the second sacrificial layer 114 has been exposed, the second sacrificial layer 114 is removed by etching, wherein the first sacrificial layer 112 is exposed (FIG. 2g). By the provision of the third sacrificial layer 116 at the second region 104, the semiconductor structure 100 is protected from being affected by said etching. The etching process may be of a same type as discussed above in connection with FIG. 2b. However a fluorine-based wet etching process may also be used. In particular, the etching process used to remove the second sacrificial layer 114 should be selective for the second sacrificial layer 114. In other words the etching process should be arranged to etch the second sacrificial layer 114 at a greater rate than the first sacrificial layer 112 and the third sacrificial layer 116, such that the second sacrificial layer 114 may be removed substantially without affecting the underlying first sacrificial layer 112 or the third sacrificial layer 116.

Following the removal of the second sacrificial layer 114, the first sacrificial layer 112 and the third sacrificial layer 116 may be removed by etching. Since both the first sacrificial layer 112 and the third sacrificial layer 116 are formed as SOC-layers of a corresponding type (or in the case of the third sacrificial layer 116 being formed as a BARC layer wherein the first sacrificial layer 112 and the third sacrificial layer 116 both include carbon compounds), the first sacrificial layer 112 and the third sacrificial layer 116 may be removed in a same etching process. The etching process may be of a same type as discussed above in connection with FIG. 2c when forming the first implantation mask 110, i.e. using an $O_2$-based plasma or an $N_2/H_2$-based plasma. The etching plasma may optionally include a forming gas in order to reduce oxidation of the semiconductor structure 100, or more specifically, the fins 102a and 104a. By the removal of the first sacrificial layer 112 and the third sacrificial layer 116, the first region 102 and the second region 104 of the semiconductor structure 100 is exposed. A desired implantation of the second region 104 has thus been achieved substantially without affecting the first region 102. Moreover, the first implantation mask 110 has been removed from the first region 102 substantially without affecting the second region 104.

Referring again to FIG. 2f and the above discussion concerning the etch back of the third sacrificial layer 116, if the etch back of the third sacrificial layer 116 is performed only until the third sacrificial layer 116 becomes flush with the second sacrificial layer 114, or only until a residual portion of the third sacrificial layer 116 remains on the second sacrificial layer 114; the first sacrificial layer 112, the second sacrificial layer 114, the third sacrificial layer 116 and the residual portion of the third sacrificial layer 116 (if present on the second sacrificial layer 114) may be removed by etching in a same etching process using $CF_4$, $SF_6$ or another fluoride-based etchant. This alternative approach may be considered to represent an alternative approach to the above described method wherein the third sacrificial layer 116 is used to protect the second region 104 during removal of the second sacrificial layer 114.

FIGS. 3a-h schematically illustrate steps of a method of implanting the first region 102 of the semiconductor structure 100. The figures show corresponding cross-sections of the semiconductor structure 100 at different stages of the method. The method illustrated in FIGS. 3a-h may be performed prior to or subsequent to the method illustrated in FIGS. 2a-h. The method of implanting the first region 102 generally corresponds to the method of implanting the second region 104 described in connection with FIGS. 2a-h, however where the method steps relating to the first region 102 instead are applied to the second region 104 and vice versa.

With reference to FIGS. 3a-c, an implantation mask 120 (which in the following will be referred to as the second implantation mask 120) is provided on the semiconductor structure 100. The disclosure relating to the first implantation mask 110 above applies correspondingly to the second implantation mask 120. However, whereas the first implantation mask 110 is provided to cover the first region 102, the second implantation mask 120 is provided to cover the second region 104. Analogous to the first implantation mask 110, the second implantation mask 120 includes a first sacrificial layer 117 formed as a SOC layer on the substrate 101 and a second sacrificial layer 118 formed as a SOG layer, the second implantation mask 120 thereby including the SOG/SOC stack. The second sacrificial layer 118 may form a dielectric antireflective coating (DARC) of the second implantation mask 120. The thickness of the first sacrificial layer 117 should be at least such that ion implantation may be prevented in the second region 104 during a subsequent ion implantation process (see below). Thereby, the SOG/SOC stack of the second implantation mask 120 may provide a desired implantation stop power or masking/shielding efficiency against impinging ions during the subsequent ion implantation process. Furthermore, the thickness of the first sacrificial layer 117 should be at least such that the fins 102a and 104a are covered by the first sacrificial layer 117. The process and materials used for forming the first sacrificial layer 117 and the second sacrificial layer 118 may be of a same type as those discussed in connection with the first sacrificial layer 112 and the second sacrificial layer 114.

The lateral dimensions of the second implantation mask 120 may be defined in a lithography process using a patterned photo resist 106 having a lateral extension corresponding to the desired lateral extension of the second implantation mask 120 and being provided at the second region 104, analogous to the discussion in connection with FIGS. 2a and 2b. Thus, as illustrated in FIGS. 3b-c the second sacrificial layer 118, and subsequently, the first sacrificial layer 117 may be removed at the first region 102 by etching. The second sacrificial layer 118 may be removed using any of the etching processes disclosed in connection with the removal of the second sacrificial layer 114 in FIG. 2b. The first sacrificial layer 117 may be removed using any of the etching processes disclosed in connection with the removal of the first sacrificial layer 112 in FIG. 2c.

Subsequent to providing the second implantation mask 120 at the second region 104, the semiconductor structure 100 is subjected to an ion implantation process, schematically indicated as P in FIG. 3d. The extension of the second implantation mask 120 is such that ion implantation in the second region 104 (which is covered by the second implantation mask 120) is counteracted and ion implantation in the first region 102 (which is left exposed by the second implantation mask 120) is allowed wherein the first region 102 may be selectively implanted. The implantation ions may be of a type which is suitable for providing the first region 102 with the desired electrical properties. In case the first region 102 is to form an n-MOS region or a p-MOS region the ions may include an n-type dopant or a p-type dopant, respectively.

Figure 3E:
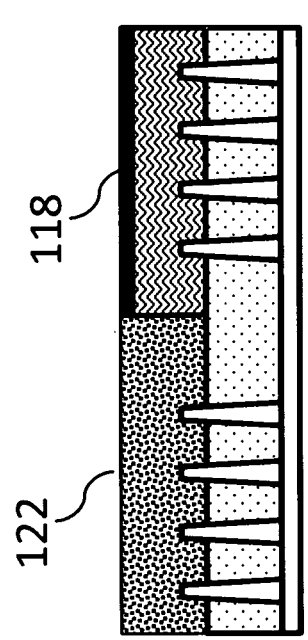
Figure 3F:
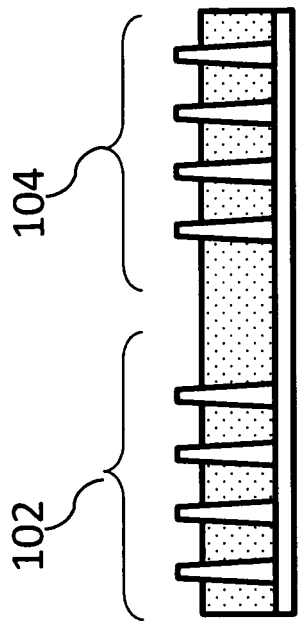
Figure 3G:
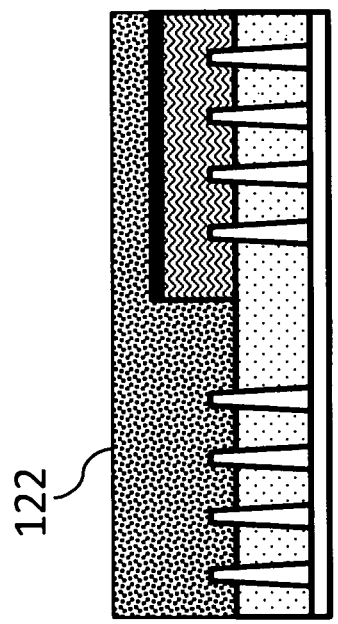
Figure 3H:
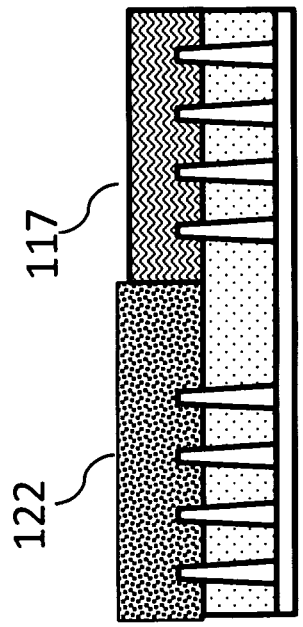

Following the ion implantation process, a fourth sacrificial layer 122 is provided on the semiconductor structure 100 (FIG. 3e). The disclosure relating to the third sacrificial layer 116 above applies correspondingly to the fourth sacrificial layer 122. Analogous to the third sacrificial layer 116, the fourth sacrificial layer 122 may be formed as a SOC layer or a BARC. The process and materials used for forming the fourth sacrificial layer 122 may be of a same type as those discussed in connection with the third sacrificial layer 116. However, whereas the third sacrificial layer 116 is provided to cover the second region 104 and the first implantation mask 110, the fourth sacrificial layer 122 is provided to cover the first region 102 and the second implantation mask 120. With reference to FIG. 3f, an exposed surface of the fourth sacrificial layer 122 may be etched until the second sacrificial layer 118 of the second implantation mask 120 is exposed (FIG. 3f). After the second sacrificial layer 118 has been exposed, the second sacrificial layer 118 is removed by etching, wherein the first sacrificial layer 117 is exposed (FIG. 3g). By the provision of the fourth sacrificial layer 122 at the first region 102, the semiconductor structure 100 is protected from being affected by the etching of the second sacrificial layer 118. The etching process may be of a same type as discussed above in connection with FIGS. 2b and 2g and FIG. 3b.

Following the removal of the second sacrificial layer 118, the first sacrificial layer 117 and the fourth sacrificial layer 122 may be removed by etching. Analogous to the removal of the first sacrificial layer 112 and the third sacrificial layer 116 in FIG. 2h, the first sacrificial layer 117 and the fourth sacrificial layer 122 may be removed in a same etching process. The etching process may be of a same type as discussed above in connection with e.g. FIG. 2c, i.e. using an $O_2$-based plasma or an $N_2/H_2$-based plasma. The etching plasma may optionally include a forming gas in order to reduce oxidation of the semiconductor structure 100, or more specifically, the fins 102a and 104a.

By the removal of the first sacrificial layer 117 and the fourth sacrificial layer 122, the first region 102 and the second region 104 of the semiconductor structure 100 is exposed. A desired implantation of the first region 104 has been achieved substantially without affecting the first region 102. Moreover, the second implantation mask 120 has been removed from the second region 104 substantially without affecting the first region 102.

The discussion in connection with FIG. 2f concerning the alternative approach including forming the third sacrificial layer 116 to cover the second sacrificial layer 114 and performing an etch back of the third sacrificial layer 116 until only a residual portion remains on the second sacrificial layer 114 or only until the second sacrificial layer 114 is exposed, is applicable also the implantation of the first region 102. Thus, according to this alternative approach, with reference to FIG. 3f the fourth sacrificial layer 122 may be formed to cover the first region 102 and the second sacrificial layer 118. The fourth sacrificial layer 122 may thereafter be etched back until the fourth sacrificial layer 122 becomes flush with the second sacrificial layer 118, or only until a residual portion of the fourth sacrificial layer 122 remains on the second sacrificial layer 118. Thereafter, the first sacrificial layer 117, the second sacrificial layer 118, the fourth sacrificial layer 122 and the residual portion of the fourth sacrificial layer 122 (if present on the second sacrificial layer 118) may be removed by etching in a same etching process using $CF_4$, $SF_6$ or another fluoride-based etchant.

Figure 4F:
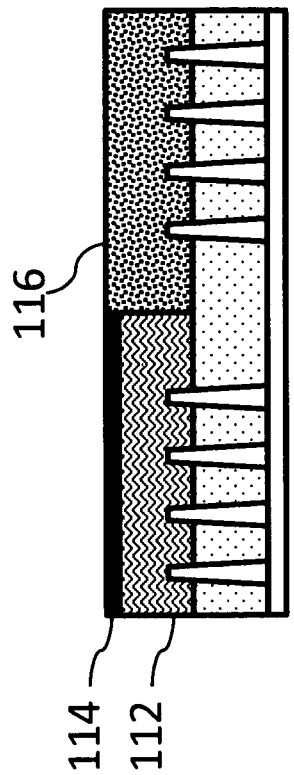
FIGS. 4a-o schematically illustrates a method of implanting a first and a second region of the semiconductor structure.
Figure 4H:
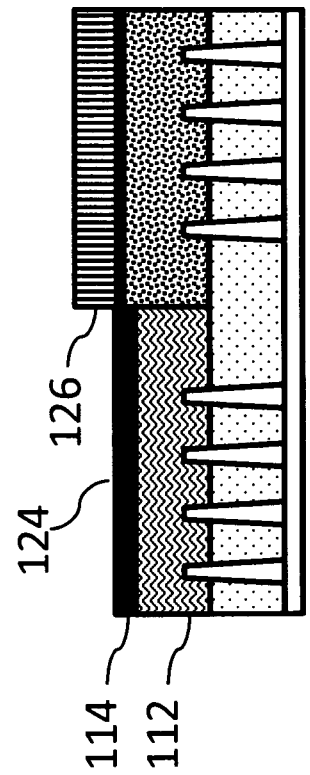
Figure 4E:
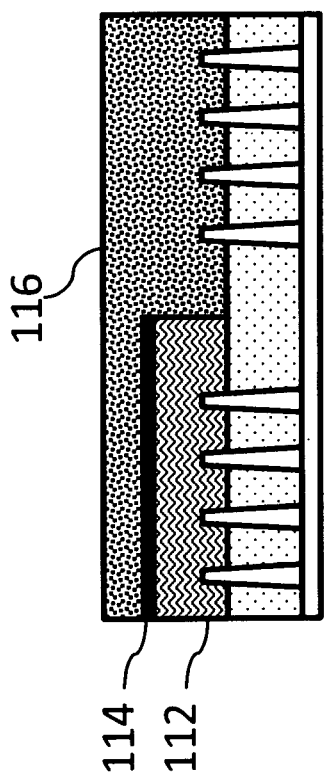
Figure 4G:
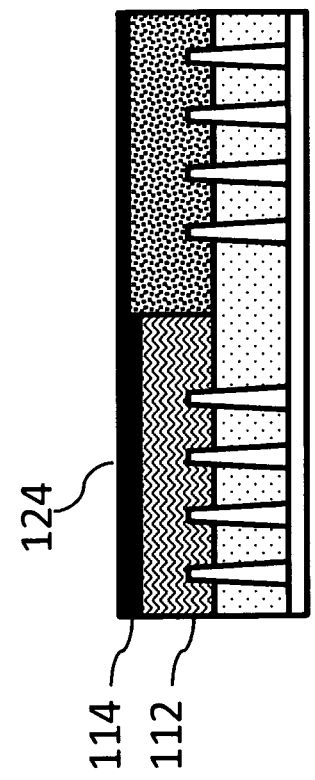
Figure 4I:
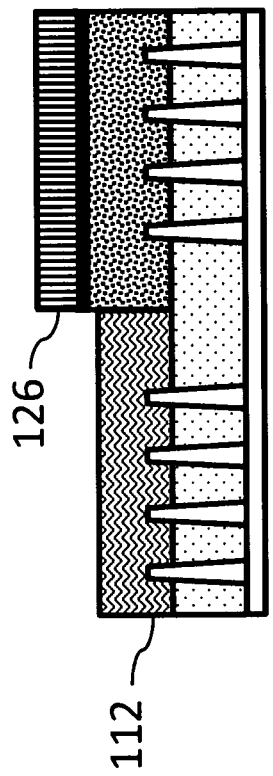
Figure 4J:
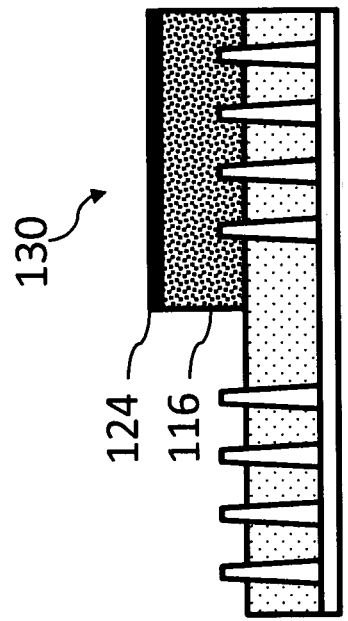
Figure 4K:
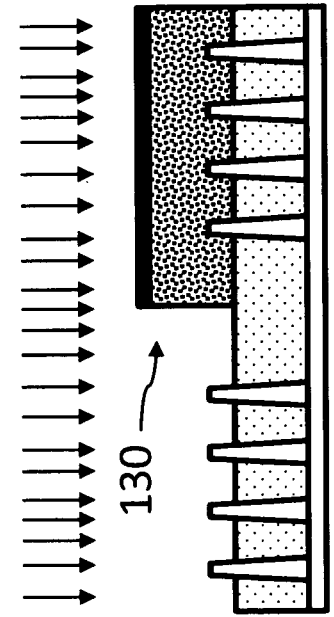
Figure 4L:
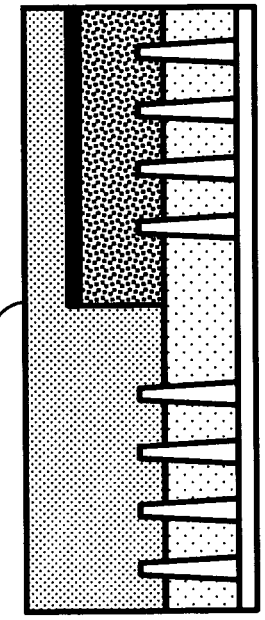
Figure 4N:
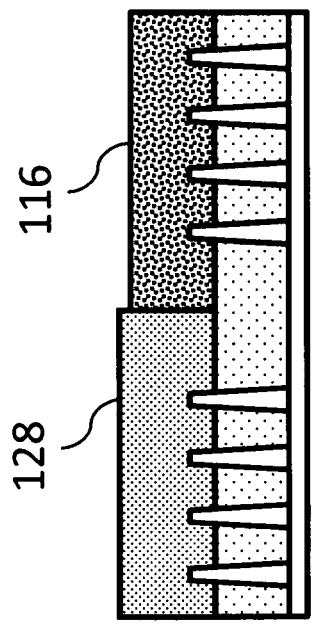
Figure 4M:
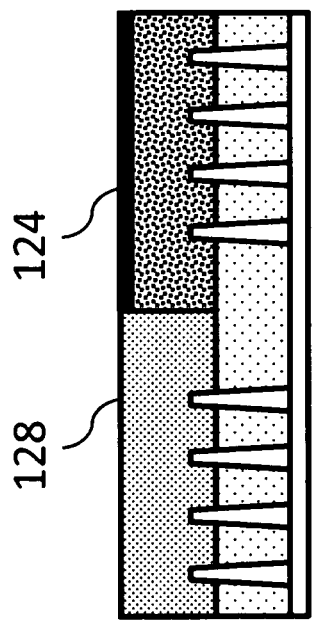
Figure 4O:
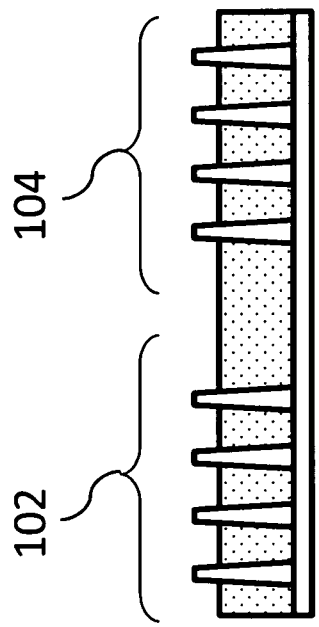

FIGS. 4a-o schematically illustrate steps of a method of sequentially implanting the first region 102 and the second region 104 of the semiconductor structure 100. The figures show corresponding cross-sections of the semiconductor structure 100 at different stages of the method. FIGS. 4a-f are analogous to FIGS. 2a-f, wherefore reference is made to the above description. However at FIG. 4g, the method deviates from the method in FIGS. 2a-f, wherein a fourth sacrificial layer 124 is formed at the first region 102 and the second region 104. The fourth sacrificial layer 124 is formed as a SOG layer and covers the third sacrificial layer 116 and the second sacrificial layer 114. The process and materials used for forming the fourth sacrificial layer 124 may be of a same type as for the second sacrificial layer 114, as discussed in connection with FIGS. 2a-h. In FIG. 4g the fourth sacrificial layer 124 is formed to cover the second sacrificial layer 114. Alternatively, the second sacrificial layer 114 may be removed by etching prior to forming the fourth sacrificial layer 124, wherein the fourth sacrificial layer 124 may be in direct contact with both the first sacrificial layer 112 and the third sacrificial layer 116.

Following forming of the fourth sacrificial layer 124, a patterned photo resist 126 is provided at 104 (FIG. 4h). The process and materials used for forming the patterned photo resist 126 may be of a same type as those discussed in connection with the photo resist 106. Portions of the fourth sacrificial layer 124 which not are covered by the patterned photo resist 126 may thereafter be selectively removed by etching (FIG. 4i). Since both the second sacrificial layer 114 and the fourth sacrificial layer 124 are formed as SOG-layers of a corresponding or same type, the second sacrificial layer 114 and the fourth sacrificial layer 124 may be removed in a same etching process. Accordingly, the etching process may be continued until the fourth sacrificial layer 124 and the second sacrificial layer 114 are removed and the first sacrificial layer 112 is exposed. During the etching, the first sacrificial layer 112 and the third sacrificial layer 116 protects the semiconductor structure 100 from being affected by the etching.

Following the removal of the fourth sacrificial layer 124 and the second sacrificial layer 114, the first sacrificial layer 112 may be removed from the first region 102 (FIG. 4j). The first sacrificial layer 112 may be removed using an etching process of a same type as discussed above in connection with e.g. FIG. 2c. The third sacrificial layer 116 and the fourth sacrificial layer 124 remaining at the second region 104 thus define an implantation mask 130 formed as a SOG/SOC stack. The fourth sacrificial layer 124 may form a dielectric antireflective coating (DARC) of the second implantation mask 130. In contrast to the method illustrated in FIGS. 2a-h, the third sacrificial layer 116 does in the method illustrated in FIGS. 4a-o hence form part of an implantation mask, i.e. the second implantation mask 130. Hence, when selecting the material for forming the third sacrificial layer 116 the implantation stop power should be considered to a same extent as when selecting the material for the first sacrificial layer 112.

Subsequent to forming the second implantation mask 130 at the second region 104, the semiconductor structure 100 is subjected to an ion implantation process, schematically indicated as P in FIG. 4k. The extension of the second implantation mask 130 is such that ion implantation in the second region 104 (which is covered by the second implantation mask 130) is counteracted and ion implantation in the first region 102 (which is left exposed by the second implantation mask 130) is allowed wherein the first region 102 may be selectively implanted.

The implantation ions used in the implantation process illustrated in FIG. 4d (i.e. a first implantation process) and the implantation ions used in the implantation process illustrated in FIG. 4k (i.e. a second implantation process) may be of a type which is suitable for providing the first region 102 and the second region 104 with the respective desired electrical properties. In case the first region 102 is to form an n-MOS region and the second region 104 is to form a p-MOS region the first implantation process may involve an n-type dopant and the second implantation process may involve a p-type dopant. However, the first region 102 may instead be formed as a p-MOS region using a p-type dopant and the second region 104 may be formed as an n-MOS region using an n-type dopant.

Following the ion implantation process, a fifth sacrificial layer 128 is provided on the semiconductor structure 100 (FIG. 4l). The fifth sacrificial layer 128 may be formed as a SOC layer. The process and materials used for forming the fifth sacrificial layer 128 may be of a same type as those discussed in connection with the third sacrificial layer 116 in FIG. 2e. Hence, the fifth sacrificial layer 128 may be any type of SOC layer that during deposition provides adequate coverage of the first region 102 and optionally also is self-planarizing such that a further planarization step not is necessary. According to yet another example the fifth sacrificial layer 128 may be formed as an organic BARC. The BARC (i.e. "BARC layer 128") may be formed by deposition of a material including a carbon compound. The BARC layer 128 may be formed using a spin deposition process however other state of the art deposition process suitable for this purpose may be also be used Analogous to FIGS. 2f-2g, an exposed surface of the fifth sacrificial layer 128 may be etched until the fourth sacrificial layer 124 of the second implantation mask 130 is exposed wherein the fourth sacrificial layer 124 subsequently may be removed by etching such that the third sacrificial layer 116 is exposed (FIGS. 4m-n). During the etching of the fourth sacrificial layer 124, the fifth sacrificial layer 128 and the third sacrificial layer 116 protects the semiconductor structure 100 from being affected by the etching. The etching process used to remove the fourth sacrificial layer 124 may be of a same type as discussed above in connection with e.g. FIG. 2b. In particular, the etching process used to remove the fourth sacrificial layer 124 should be selective for the fourth sacrificial layer 124. In other words the etching process should be arranged to etch the fourth sacrificial layer 124 at a greater rate than the third sacrificial layer 116 and the fifth sacrificial layer 128, such that the fourth sacrificial layer 124 may be removed substantially without affecting the underlying third sacrificial layer 116 or the fifth sacrificial layer 128.

Following the removal of the fourth sacrificial layer 124, the fifth sacrificial layer 128 and the third sacrificial layer 116 may be removed by etching. Analogous to the removal of the first sacrificial layer 112 and the third sacrificial layer 116 in FIG. 2h, the fifth sacrificial layer 128 and the third sacrificial layer 116 may be removed in a same etching process. The etching process may be of a same type as discussed above in connection with e.g. FIG. 2c. The etching plasma may optionally include a forming gas in order to reduce oxidation of the semiconductor structure 100, or more specifically, the fins 102a and 104a.

By the removal of the fifth sacrificial layer 128 and the third sacrificial layer 116, the first region 102 and the second region 104 of the semiconductor structure 100 is exposed. Desired implantations of both the first region 102 and the second region 104 have been achieved and both the first implantation mask 110 and the second implantation mask 130 have been removed from the first region 102 and the second region 104, respectively, substantially without affecting the first region 102 or the second region 104.

Although referred to as "a fourth sacrificial layer", the fourth sacrificial layer 124 should not be confused with the fourth sacrificial layer 122 referred to in connection with FIGS. 3a-h. Thus, to facilitate understanding, with reference to FIGS. 2a-h, the first sacrificial layer 112 may be referred to as a first SOC layer 112, the second sacrificial layer 114 may be referred to as a first SOG layer 114 and the third sacrificial layer 116 may be referred to as a second SOC layer 116 (or a first BARC layer 116). Furthermore, with reference to FIGS. 3a-h, the first sacrificial layer 117 may be referred to as a third SOC layer 117, the second sacrificial layer 118 may be referred to as a second SOG layer 118 and the fourth sacrificial layer 122 may be referred to as fourth SOC layer 122 (or a second BARC layer 122). Furthermore, with reference to FIGS. 4a-o, the first sacrificial layer 112 may be referred to as a first SOC layer 112, the second sacrificial layer 114 may be referred to as a first SOG layer 114, the third sacrificial layer 116 may be referred to as a second SOC layer 116, the fourth sacrificial layer 124 may be referred to as a third SOG layer 124, the fifth sacrificial layer 128 may be referred to as a fifth SOC layer 128 (or a third BARC layer 128).

Figure 5:
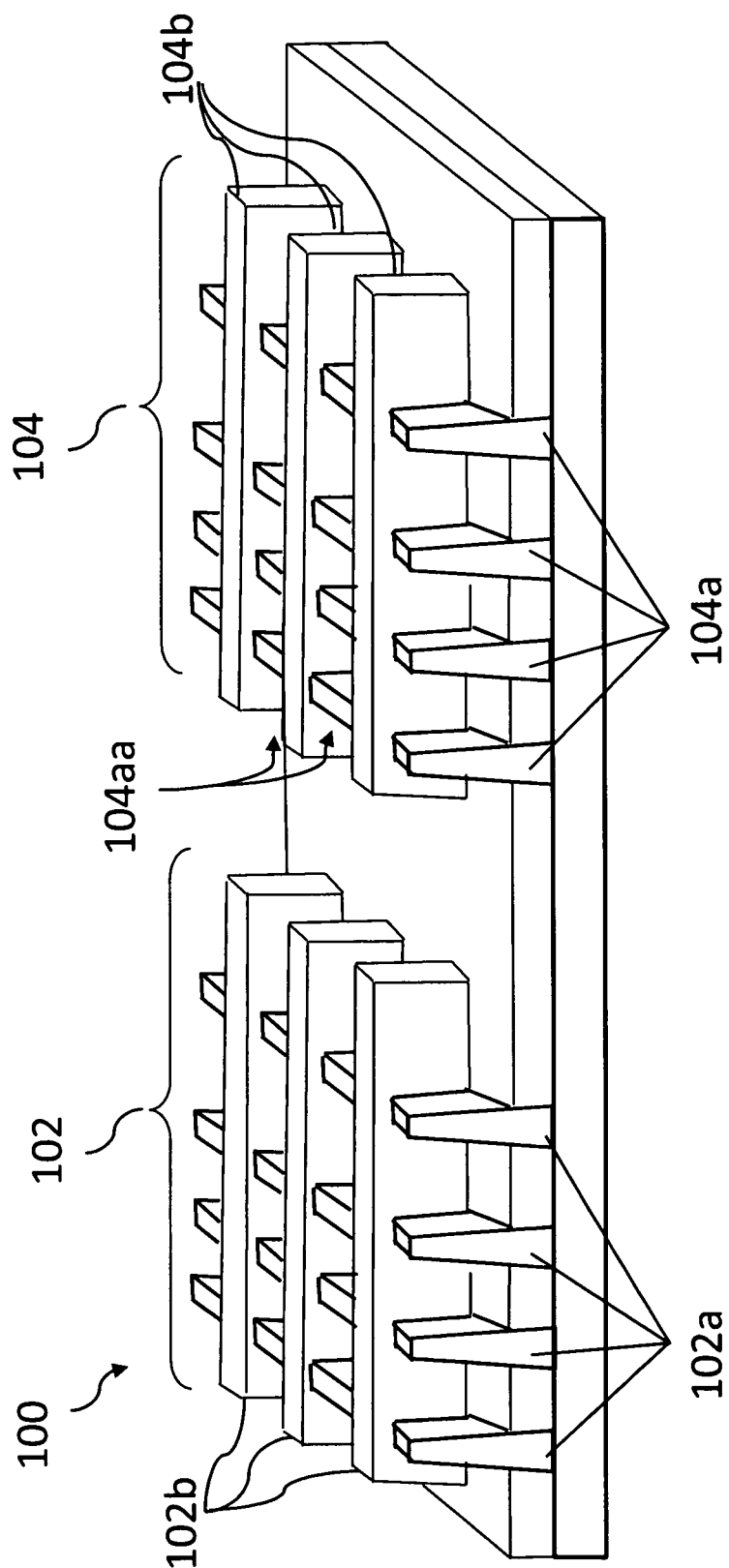
FIG. 5 schematically illustrates a semiconductor structure provided with gate stacks.

In the above, methods for implanting the first region 102 and the second region 104 have been disclosed. However, similar methods may be applied when a gate stack is arranged at a semiconductor structure. FIG. 5 illustrates the semiconductor structure 100 wherein a first set of gate stacks 102b are arranged at the first region 102 and a second set of gate stacks 104b are arranged at the second region 104. In FIG. 5 the first set of gate stacks 102b and the second set of gate stacks 104b each include three gate stacks, however this is merely one example and the first and the second sets of gate stacks 102b, 104b may each include one, two or even more than three gate stacks, depending on the application in which the semiconductor structure 100 is to be used. The number of gate stacks of the first set 102b need also not be equal to the number of gate stacks of the second set 104b.

Each gate stack of the first set of gate stacks 102b and the second set of gate stacks 104b may, as is well known in the art, include a gate conductor and a gate insulator arranged between the gate conductor and the surface of a respective fin 102a, 104a. The gate stack may further include a gate cap. Each gate stacks may further be provided with a pair of spacers. The gate stacks may be formed according to techniques which are well-known in the art. For example the gate conductor may be provided by depositing a conducting material on the first region 102 and the second region 104 and selectively removing undesired portions of the conducting material using lithography and subsequent etching to define the lateral dimensions of the gate stacks. Purely by way of example, if the fins 102a, 104a have a height in the order of 10-50 nm a typical height of a gate stack may be in the order of 100 nm.

After providing the gate stacks 102b, 104b the method disclosed in connection with FIGS. 2a-h may be applied to implant the second region 104 to form source and drain regions in the fins 104a as schematically indicated by the common reference numeral 104aa. Likewise, the method disclosed in connection with FIGS. 3a-h may be applied to implant the first region 102 to form source and drain regions in the fins 102a. Alternatively, the method disclosed in connection with FIGS. 4a-o may be applied to implant source and drain regions in the fins 102a and 104a.

If applying the method disclosed in connection with FIGS. 2a-h, the first sacrificial layer 112 of the first implantation mask 110 should be formed with a thickness such that both the fins 102a of the first region 102 and the first set of gate stacks 102b are covered by the first sacrificial layer 112 and are protected from impinging ions during ion implantation. The third sacrificial layer 116 should be formed with a thickness such that both the fins 104a of the second region 104 and the second set of gate stacks 104b are covered by the third sacrificial layer 116.

If applying the method disclosed in connection with FIGS. 3a-h, the first sacrificial layer 117 of the second implantation mask 120 should be formed with a thickness such that both the fins 104a of the second region 104 and the second set of gate stacks 104b are covered by the first sacrificial layer 117 and are protected from impinging ions during ion implantation. The fourth sacrificial layer 122 should be formed with a thickness such that both the fins 102a of the first region 102 and the first set of gate stacks 102b are covered by the fourth sacrificial layer 122.

If applying the method disclosed in connection with FIGS. 4a-o, the first sacrificial layer 112 of the first implantation mask 110 should be formed with a thickness such that both the fins 102a of the first region 102 and the first set of gate stacks 102b are covered by the first sacrificial layer 112 and are protected from impinging ions during a first ion implantation. The third sacrificial layer 116 should be formed with a thickness such that both the fins 104a of the second region 104 and the second set of gate stacks 104b are covered by the third sacrificial layer 116 and are protected from impinging ions during a second ion implantation.

In each one of the methods, the implantation ions may be of a type which is suitable for the respective region, e.g. depending on whether the region forms an n-MOS region or a p-MOS region. During the implantation process, the implantation masks 110, 120, 130 may cover the region which is not to be implanted. Subsequent to the implantation process(es) the sacrificial layers forming the implantation masks may, as described above, be removed substantially without affecting the first region 102 or the second region 104.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A method of providing an implanted region in a semiconductor structure including a first region and a second region, the method comprising:
    providing a first implantation mask covering the first region of the semiconductor structure, the first implantation mask including a first sacrificial layer, wherein the first sacrificial layer is formed as a spin-on-carbon layer, and a second sacrificial layer, wherein the second sacrificial layer is formed as a spin-on-glass layer;
    subjecting the semiconductor structure to an ion implantation process, wherein an extension of the first implantation mask is such that ion implantation in the first region is counteracted and ion implantation in the second region is allowed where the second region is implanted;
    forming a third sacrificial layer covering the second region of the semiconductor structure, wherein the third sacrificial layer includes carbon;
    removing the second sacrificial layer at the first region by etching, wherein the third sacrificial layer protects the second region from being affected by the etching, and
    removing the first sacrificial layer at the first region and the third sacrificial layer at the second region by etching.

2. The method according to claim 1, wherein the first sacrificial layer and the third sacrificial layer are arranged to be etched by a same etchant.

3. The method according to claim 1, wherein the third sacrificial layer is formed to cover the second region and the second sacrificial layer at the first region, and wherein the method further comprises: etching an exposed surface of the third sacrificial layer until the second sacrificial layer at the first region is exposed and, thereafter removing the second sacrificial layer at the first region by etching.

4. The method according to claim 1, further comprising, subsequent to removing the first sacrificial layer at the first region and the third sacrificial layer at the second region:
providing a second implantation mask covering the second region of the semiconductor structure, the second implantation mask including a first sacrificial layer, wherein the first sacrificial layer of the second implantation mask is formed as a spin-on-carbon layer, and a second sacrificial layer, wherein the second sacrificial layer of the second implantation mask is formed as a spin-on-glass layer;
subjecting the semiconductor structure to an ion implantation process, wherein an extension of the second implantation mask is such that ion implantation in the second region is counteracted and ion implantation in the first region is allowed where the first region is implanted;
forming a fourth sacrificial layer covering the first region of the semiconductor structure, wherein the fourth sacrificial layer includes carbon;
removing the second sacrificial layer of the second implantation mask at the second region by etching, wherein the fourth sacrificial layer protects the first region from being affected by the etching; and
removing the first sacrificial layer of the second implantation mask at the second region and the fourth sacrificial layer at the first region by etching.

5. The method according to claim 4, wherein the first sacrificial layer and the fourth sacrificial layer are arranged to be etched by a same etchant.

6. The method according to claim 4, wherein the fourth sacrificial layer is formed to cover the first region and the second sacrificial layer of the second implantation mask at the second region, and wherein the method further comprises:
etching an exposed surface of the fourth sacrificial layer until the second sacrificial layer of the second implantation mask at the second region is exposed; and
thereafter removing the second sacrificial layer of the second implantation mask at the second region by etching.

7. The method according to claim 1, further comprising, subsequent to forming the third sacrificial layer at the second region of the semiconductor structure and prior to removing the first sacrificial layer at the first region and the third sacrificial layer at the second region by etching:
forming a fourth sacrificial layer at the first and the second region, wherein the fourth sacrificial layer is formed as a spin-on-glass layer;
removing the fourth sacrificial layer at the first region by etching wherein the first sacrificial layer protects the first region from being affected by the etching;
removing the first sacrificial layer at the first region, wherein the third sacrificial layer at the second region and the fourth sacrificial layer at the second region forms a second implantation mask covering the second region of the semiconductor structure; and
subjecting the semiconductor structure to an ion implantation process, wherein an extension of the second implantation mask is such that ion implantation in the second region is counteracted and ion implantation in the first region is allowed where the first region is implanted.

8. The method according to claim 7, wherein the fourth sacrificial layer is formed prior to or subsequent to removing the second sacrificial layer at the first region by etching.

9. A method according to claim 7, further comprising, subsequent to implanting the first region:
forming a fifth sacrificial layer at the first region of the semiconductor structure, wherein the fifth sacrificial layer includes carbon;
removing the fourth sacrificial layer of the second implantation mask at the second region by etching, wherein the fifth sacrificial layer protects the first region from being affected by the etching; and
removing the third sacrificial layer at the second region and the fifth sacrificial layer at the first region by etching.

10. The method according to claim 9, wherein the third sacrificial layer and the fifth sacrificial layer are arranged to be etched by a same etchant.

11. The method according to claim 9, wherein the fifth sacrificial layer is formed to cover the first region and the fourth sacrificial layer at the second region, and wherein the method further comprises etching an exposed surface of the fifth sacrificial layer until the fourth sacrificial layer at the second region is exposed and, thereafter removing the fourth sacrificial layer of the second implantation mask at the second region by etching.

12. The method according to claim 11, wherein the third sacrificial layer is formed as a spin-on-carbon layer.

13. The method according to claim 12, wherein the fourth sacrificial layer is formed as a spin-on-carbon layer.

14. The method according to claim 12, wherein the fifth sacrificial layer is formed as a spin-on-carbon layer.

15. The method according to claim 12, wherein the first region of the semiconductor structure includes at least one fin-shaped feature and the second region of the semiconductor structure includes at least one fin-shaped feature.

16. A method of providing an implanted region in a semiconductor structure including a first region and a second region, the method comprising:
providing a first implantation mask covering the first region of the semiconductor structure, the first implantation mask including a first sacrificial layer, wherein the first sacrificial layer is formed as a spin-on-carbon layer, and a second sacrificial layer, wherein the second sacrificial layer is formed as a spin-on-glass layer;
subjecting the semiconductor structure to an ion implantation process, wherein an extension of the first implantation mask is such that ion implantation in the first region is counteracted and ion implantation in the second region is allowed where the second region is implanted;
forming a third sacrificial layer covering the second region of the semiconductor structure, wherein the third sacrificial layer includes carbon; and
removing the first sacrificial layer of the first implantation mask, the second sacrificial layer of the first implantation mask and the third sacrificial layer by a same etching process including an etchant comprising fluoride.

17. The method according to claim 16, wherein the third sacrificial layer is formed to cover the second region and the second sacrificial layer at the first region, the method further comprising:
reducing a thickness of the third sacrificial layer at the first region and at the second region by etching an exposed surface of the third sacrificial layer until a residual portion of the third sacrificial layer remains on the second sacrificial layer, or until the second sacrificial layer at the first region is exposed, and thereafter removing the first sacrificial layer, the second sacrificial layer and the third sacrificial layer, and the residual portion if present on the second sacrificial layer, by the same etching process.

* * * * *